US012665159B2

(12) United States Patent
Zeidler et al.

(10) Patent No.: US 12,665,159 B2
(45) Date of Patent: Jun. 23, 2026

(54) MULTI-BEAM PARTICLE BEAM SYSTEM

(71) Applicant: Carl Zeiss MultiSEM GmbH, Oberkochen (DE)

(72) Inventors: Dirk Zeidler, Oberkochen (DE); Thomas Schmid, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 434 days.

(21) Appl. No.: 18/488,617

(22) Filed: Oct. 17, 2023

(65) Prior Publication Data

US 2024/0136146 A1    Apr. 25, 2024
US 2024/0234080 A9    Jul. 11, 2024

(30) Foreign Application Priority Data

Oct. 19, 2022    (DE) .......................... 102022127562.0

(51) Int. Cl.
*H01J 37/10*          (2006.01)
*H01J 37/147*         (2006.01)
*H01J 37/28*          (2006.01)

(52) U.S. Cl.
CPC .......... *H01J 37/10* (2013.01); *H01J 37/1474* (2013.01); *H01J 37/28* (2013.01)

(58) Field of Classification Search
CPC ........ H01J 37/10; H01J 37/1474; H01J 37/28; H01J 2237/1534; H01J 37/153
See application file for complete search history.

(56) References Cited

U.S. PATENT DOCUMENTS

| | | |
|---|---|---|
| 4,130,761 A | 12/1978 | Matsuda |
| 4,153,843 A | 5/1979 | Pease |
| 4,200,794 A | 4/1980 | Newberry |

(Continued)

FOREIGN PATENT DOCUMENTS

| | | | | |
|---|---|---|---|---|
| DE | 100 01 277 A1 | 7/2001 | | |
| DE | 10107910 A1 * | 8/2002 | ............ | H01J 37/153 |

(Continued)

OTHER PUBLICATIONS

German Office Action, with translation thereof, for corresponding DE Appl No. 10 2022 127 562.0, dated Jun. 21, 2023.

(Continued)

*Primary Examiner* — David A Vanore
(74) *Attorney, Agent, or Firm* — Fish & Richardson P.C.

(57)          ABSTRACT

A multi-beam particle beam system comprises a particle beam source for creating a beam of charged particles, and a beam splitter for splitting the beam into a bundle of particle beams. The beam splitter comprises a multi-aperture plate having openings. A particle optical unit is provided to focus each of the particle beams in an object plane. A correction optical unit is provided for compensating for at least one aberration of the particle optical unit and comprises three or five hexapod elements and a plurality of round lens elements. The hexapod elements are successively arranged between the particle source and the multi-aperture plate in the beam path. A round lens element is arranged between each pair of hexapod elements arranged directly in succession in the beam path.

20 Claims, 2 Drawing Sheets

(56) References Cited

U.S. PATENT DOCUMENTS

| | | | |
|---|---|---|---|
| 4,338,548 A * | 7/1982 | Bono | H01J 3/18 |
| | | | 315/382 |
| 4,742,234 A * | 5/1988 | Feldman | H01J 37/3007 |
| | | | 250/398 |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 * | 9/2005 | Adamec | H01J 37/04 |
| | | | 250/306 |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 * | 9/2006 | Ono | H01J 37/045 |
| | | | 250/492.23 |
| 7,126,141 B2 | 10/2006 | Ono | |
| 7,129,502 B2 * | 10/2006 | Kruit | H01J 37/12 |
| | | | 250/398 |
| 7,244,949 B2 | 7/2007 | Knippelmeyer | |
| 7,285,779 B2 | 10/2007 | Litman | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 * | 1/2013 | Han | H01J 37/04 |
| | | | 250/306 |
| 8,384,051 B2 | 2/2013 | Ozawa | |
| 8,598,525 B2 | 12/2013 | Zeidler | |
| 8,618,496 B2 * | 12/2013 | Wieland | H01J 37/045 |
| | | | 250/397 |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 * | 10/2015 | Almogy | H01J 37/28 |
| 9,263,233 B2 | 2/2016 | Zeidler | |
| 9,336,981 B2 * | 5/2016 | Knippelmeyer | H01J 37/244 |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 * | 3/2017 | Liu | H01J 37/04 |
| 9,653,254 B2 | 5/2017 | Zeidler | |

| | | | |
|---|---|---|---|
| 9,702,983 B2 | 7/2017 | Eder | |
| 9,922,796 B1 * | 3/2018 | Frosien | H01J 37/153 |
| 9,922,799 B2 | 3/2018 | Li | |
| 9,991,089 B2 | 6/2018 | Mueller | |
| 10,062,541 B2 | 8/2018 | Ren | |
| 10,141,160 B2 * | 11/2018 | Ren | H01J 37/244 |
| 10,176,965 B1 * | 1/2019 | Breuer | H01J 37/153 |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 * | 3/2020 | Okada | G03F 7/2059 |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,811,215 B2 | 10/2020 | Zeidler | |
| 10,854,423 B2 | 12/2020 | Sarov | |
| 10,879,031 B2 * | 12/2020 | Ren | H01J 37/1477 |
| 10,896,800 B2 | 1/2021 | Riedesel | |
| 10,923,313 B1 * | 2/2021 | Cook | H01J 37/09 |
| 11,183,364 B1 * | 11/2021 | Deng | H01J 37/28 |
| 12,202,019 B2 * | 1/2025 | Smits | H01J 37/18 |
| 2009/0014649 A1 * | 1/2009 | Nakasuji | H01J 37/153 |
| | | | 250/310 |
| 2010/0320382 A1 * | 12/2010 | Almogy | H01J 37/05 |
| | | | 250/311 |
| 2013/0299697 A1 | 11/2013 | Enyama et al. | |
| 2014/0103201 A1 * | 4/2014 | Kramer | H01J 37/153 |
| | | | 250/252.1 |
| 2014/0197325 A1 | 7/2014 | Kato | |
| 2014/0224985 A1 | 8/2014 | Rodgers et al. | |
| 2016/0247663 A1 * | 8/2016 | Schubert | H01J 37/1472 |
| 2017/0117114 A1 * | 4/2017 | Zeidler | H01J 37/28 |
| 2017/0133198 A1 * | 5/2017 | Kruit | H01J 37/244 |
| 2018/0158642 A1 * | 6/2018 | Frosien | H01J 37/28 |
| 2019/0333732 A1 | 10/2019 | Ren | |
| 2019/0355545 A1 * | 11/2019 | Zeidler | H01J 37/21 |
| 2020/0211810 A1 | 7/2020 | Zeidler | |
| 2020/0243300 A1 | 7/2020 | Zeidler | |
| 2020/0373116 A1 * | 11/2020 | Zeidler | H01J 37/09 |
| 2021/0005423 A1 | 1/2021 | Zeidler | |
| 2021/0035773 A1 * | 2/2021 | Zeidler | H01J 37/244 |
| 2021/0210303 A1 * | 7/2021 | Zeidler | H01J 37/04 |
| 2021/0302333 A1 * | 9/2021 | Henstra | G01N 23/207 |
| 2021/0305007 A1 * | 9/2021 | Henstra | H01J 37/20 |
| 2021/0366686 A1 * | 11/2021 | Winkler | H01J 37/20 |
| 2022/0336187 A1 * | 10/2022 | De | H01J 37/20 |
| 2023/0005708 A1 * | 1/2023 | Zeidler | H01J 37/1474 |
| 2023/0207253 A1 * | 6/2023 | Wieland | H01J 37/302 |
| | | | 250/307 |
| 2023/0299697 A1 | 9/2023 | Ding et al. | |
| 2024/0047169 A1 * | 2/2024 | Henstra | H01J 37/153 |
| 2024/0087838 A1 * | 3/2024 | Schubert | H01J 37/153 |
| 2024/0096586 A1 * | 3/2024 | Jiang | H01J 37/04 |
| 2024/0096587 A1 * | 3/2024 | Zeidler | H01J 37/1477 |
| 2024/0136146 A1 * | 4/2024 | Zeidler | H01J 37/1474 |
| 2025/0210300 A1 * | 6/2025 | Zeidler | H01J 37/28 |
| 2026/0011524 A1 * | 1/2026 | Storeck | H01J 37/18 |

FOREIGN PATENT DOCUMENTS

| | | | |
|---|---|---|---|
| DE | 10 2013 014 976 A1 | 3/2015 | |
| DE | 10 2013 016 113 A1 | 3/2015 | |
| DE | 10 2014 008 105 A1 | 12/2015 | |
| DE | 10 2014 008 083 B4 | 8/2017 | |
| GB | 2519511 A | 4/2015 | |
| GB | 2521819 A | 7/2015 | |
| JP | 59184524 A | 10/1984 | |
| JP | 60042825 A | 3/1985 | |
| JP | 60105229 A | 6/1985 | |
| JP | 61263217 A | 11/1986 | |
| JP | 2014229481 A | 12/2014 | |
| WO | WO 2005/024881 A2 | 3/2005 | |
| WO | WO 2007/028596 A1 | 3/2007 | |
| WO | WO2013032949 A1 | 3/2013 | |
| WO | WO-2019241054 A1 * | 12/2019 | G03F 7/70633 |
| WO | WO2020057678 A1 | 3/2020 | |

(56)     References Cited

FOREIGN PATENT DOCUMENTS

| WO | WO2020064035 | A1 | 4/2020 | | |
| WO | WO2020065094 | A1 | 4/2020 | | |
| WO | WO2020070074 | A1 | 4/2020 | | |
| WO | WO2020151904 | A2 | 7/2020 | | |
| WO | WO2020249147 | A1 | 12/2020 | | |
| WO | WO-2025031787 | A1 | * | 2/2025 | ............. H01J 37/28 |

OTHER PUBLICATIONS

H. Müller et al., Overview of commercially available CEOS hexapole-type aberration correctors, Microscopy and Microanalysis 20 (2014) pp. 934-935.
A.L. Eberle et al., "High-resolution, high-throughput imaging with a multibeam scanning electron microscope", *Journal of Microscopy, vol. 259, Issue 2 2015, pp. 114-120.*

* cited by examiner

MULTI-BEAM PARTICLE BEAM SYSTEM

CROSS-REFERENCE TO RELATED APPLICATION

This application claims benefit under 35 U.S.C. § 119 to German Application No. 10 2022 127 562.0, filed Oct. 19, 2022. The entire disclosure of this application is incorporated by reference herein.

FIELD

The disclosure relates to multi-beam particle beam systems which operate with a plurality of particle beams.

BACKGROUND

For example, A. L. Eberle et al., *High-resolution, high-throughput imaging with a multibeam scanning electron microscope, Journal of microscopy* 259 (2015), DE 10 2014 008 105 A1, DE 10 2014 008 083 B4, DE 10 2013 016 113 A1, DE 10 2013 014 976 A1, US 2016/0247663 A1, US 2014/0224985 A1, WO 2007/028596 A1 and WO 2005/024881 A2 have disclosed electron microscope systems which operate with a plurality of electron beams in order to use the latter to scan, in parallel, an object to be examined. The plurality of electron beams is created by virtue of an electron beam created by an electron source being split by a beam splitter into a bundle of a plurality of electron beams. This beam splitter uses a multi-aperture plate which has a multiplicity of openings. One portion of the electrons of the electron beam impinges on the multi-aperture plate and is absorbed there, and another portion of the electrons passes through the openings of the multi-aperture plate, such that an electron beam is shaped in the beam path downstream of each opening, the cross section of the electron beam being defined by the shape of the opening. One or more further multi-aperture plates, the openings of which are traversed by in each case one of the electron beams, may be provided downstream of this multi-aperture plate in the beam path. Suitably chosen electrical fields provided in the beam path upstream of, between and/or downstream of such multi-aperture plates, lead to the openings of the multi-aperture plates acting as lenses on the electron beams passing through the openings, with the result that a real or virtual focus arises in a plane outside the multi-aperture plate. The plane in which the foci of the electron beams are formed is imaged by a particle optical unit onto a surface of an object to be examined, and so the individual electron beams impinge on the object in a focused manner as a bundle of primary beams alongside one another. There they create backscattered electrons or secondary electrons which emanate from the object, are shaped to form a bundle of secondary beams and are directed to a detector array by a further imaging optical unit. Each of the secondary beams is incident on a separate detector element such that the electron intensities detected by the detector elements provide information concerning the object at the location at which the corresponding primary beam is incident on the object. The multiplicity of primary beams are scanned systematically in parallel over the surface of the object in order to create an electron micrograph of the object in the manner that is customary for scanning electron microscopes.

SUMMARY

It was found that certain conventional multi-beam particle beam systems do not meet certain expectations. For example, it appears that it can be difficult to focus all of the particle beams of a bundle of particle beams together in an object plane such that each focused particle beam illuminates the smallest possible spot on an object arranged in the object plane.

Accordingly, the present disclosure seeks to provide a multi-beam particle beam system in which all of the particle beams of a bundle of particle beams are focusable together in an object plane.

According to the disclosure, a multi-beam particle beam system comprises a particle beam source configured to create a beam of charged particles, and a beam splitter configured to create a bundle of a plurality of particle beams from the particles of the beam of charged particles, the beam splitter comprising a multi-aperture plate, which is a plate having a multiplicity of openings that is arranged in a beam path of the beam of charged particles. Further, the multi-beam particle beam system comprises a particle optical unit configured to focus each of the particle beams of the plurality of particle beams in an object plane, and a correction optical unit configured to compensate for at least one aberration of the particle optical unit.

A particle optical unit whose object is to image a first plane into a second plane can exhibit optical aberrations. An example of such an aberration is what is known as field curvature, which leads to the geometric surface, in which the image of the first plane arises, not being a flat plane when the first plane is flat, but instead being an approximately spherically curved surface. A distance of this surface, in which the focused image representation of the first plane actually arises, from the second plane, in which the creation of the image is desired, increases with increasing distance from an optical axis of the particle optical unit if the assumption is made that the first plane and the spherical surface coincide on this optical axis. A further example of an aberration of the particle optical unit is the field astigmatism, which leads to an astigmatic distortion when imaging parts of the object plane into the image plane, with this aberration likewise increasing with distance from the optical axis of the particle optical unit.

According to exemplary embodiments of the disclosure, the correction optical unit comprises a plurality of hexapod elements and a plurality of round lens elements, which are each traversed by a bundle of the plurality of particle beams and are successively arranged between the particle beam source and the object plane in the beam path of the charged particles.

According to exemplary embodiments, the correction optical unit comprises three hexapod elements or five hexapod elements.

According to a further exemplary embodiment, a round lens element is arranged in the beam path between each pair of hexapod elements arranged directly in succession in the beam path.

According to exemplary embodiments, the correction optical unit is arranged between the particle source and the multi-aperture plate in the beam path.

According to further exemplary embodiments, the correction optical unit is arranged between the multi-aperture plate and the particle optical unit in the beam path.

During the operation of the multi-beam particle beam system, the round lens elements create an electric field and/or a magnetic field, which deflect particles that pass through the round lens element. This electric and/or magnetic field has a monopole symmetry in relation to a main axis of the round lens element. The hexapod elements likewise create an electric and/or a magnetic field during operation, the field deflecting the particles that pass through the hexapod element and having a hexapod symmetry in relation to a main axis of the hexapod element. The field provided by the hexapod element increases more strongly with increasing distance from the optical axis than the field provided by a round lens element. Therefore, aberrations of the particle optical unit, which itself comprises one or more round lens elements, can be compensated for with the aid of hexapod elements since for example the aforementioned field curvature is not able to be compensated for purely using particle optical lenses with round lens symmetry.

Because the fields with hexapole symmetry do not have round symmetry or monopole symmetry about the main axis, the correction optical unit comprises a plurality of hexapod elements successively arranged in the beam path, the orientations of the hexapod elements being twisted relative to one another about the main axis.

According to exemplary embodiments, all of the round lens elements arranged between a respective pair of hexapod elements have an identical focal length.

According to exemplary embodiments, the particle source comprises a particle emitter and the multi-beam particle beam system is configured such that an image of the particle emitter is created in the beam path downstream of the beam splitter by each of the particle beams. Further, the multi-beam particle beam system is configured such that the image of the particle emitter is imaged into the object plane by each of the particle beams.

According to exemplary embodiments, the multi-beam particle beam system further comprises a projection system configured to project electrons emanating from the object plane onto a detector. The electrons emanating from the object plane are created at the surface of an object by the focused particle beams, the object being arranged in the object plane during the operation of the multi-beam particle beam system.

According to exemplary embodiments, the projection system is configured such that it images the object plane into an image plane using the electrons emanating from the object plane, with the result that different locations in the object plane optically correspond to different locations in the image plane. A spatially resolving detector could be arranged in this image plane, with the result that the electrons created by the individual focused particle beams incident on the object can be detected in a manner assigned to the particle beams. According to exemplary embodiments, the image plane of the projection system is located in the beam path between the object plane and the detector, with, however, the system furthermore being configured such that the electrons created by the individual focused particle beams can be detected in a manner assigned to the particle beams.

According to the disclosure, a method for operating a multi-beam particle beam system is further provided, in the case of which a beam of charged particles is created, the beam of charged particles is split into a bundle of a plurality of particle beams, and the particle beams are each focused in an object plane with the aid of a particle optical unit. According to exemplary embodiments, the method further comprises influencing the charged particles with the aid of a correction optical unit, in such a way that an aberration of the particle optical unit is compensated for. According to exemplary embodiments, the correction optical unit has the aforementioned configuration and effect.

BRIEF DESCRIPTION OF THE DRAWINGS

Embodiments of the multi-beam particle beam system are explained in more detail hereinbelow with reference to the drawings. In detail.

EXEMPLARY EMBODIMENTS

Figure 1:
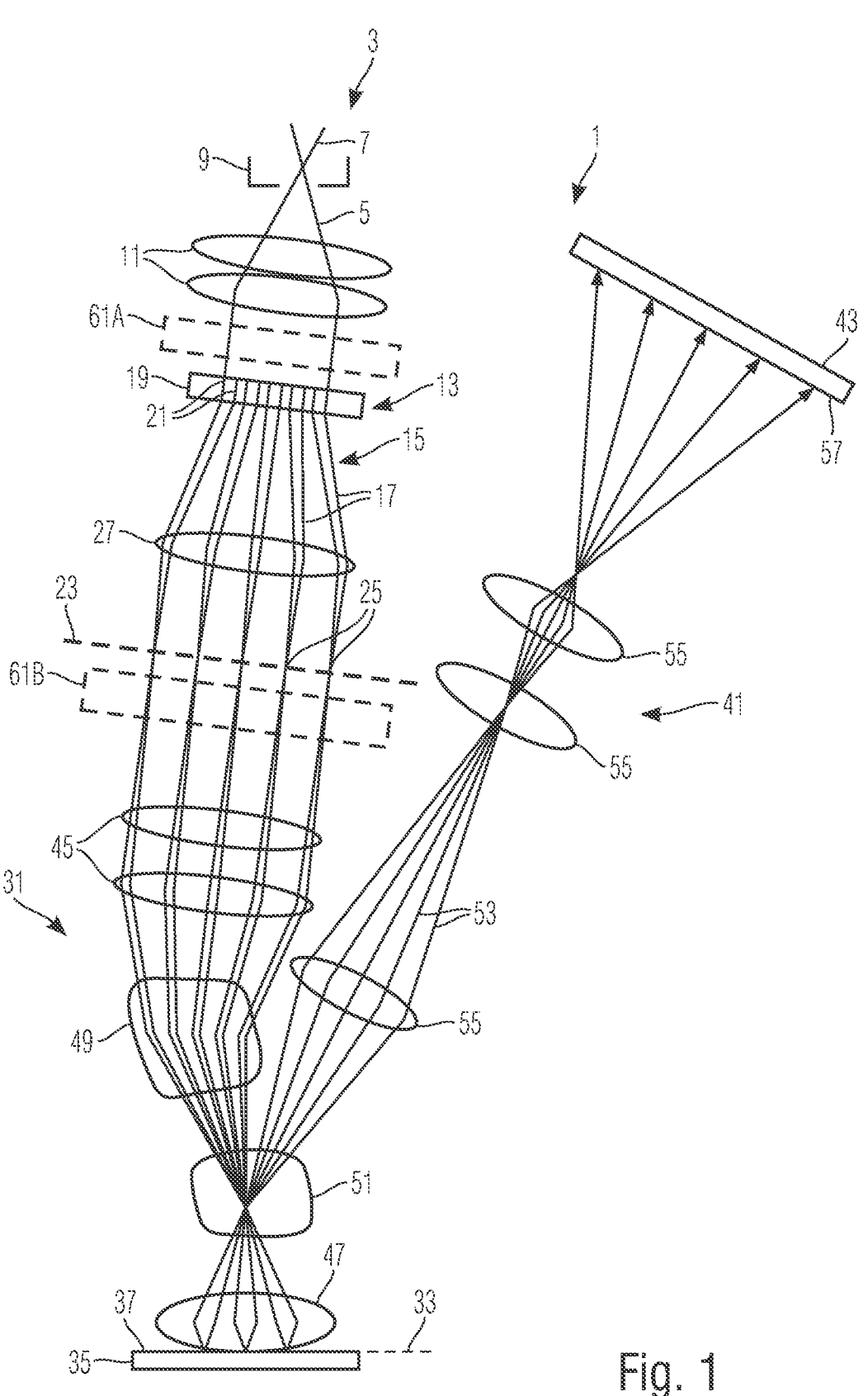
FIG. 1 shows a schematic illustration of a multi-beam particle beam system.

A multi-beam particle beam system 1 comprises a particle beam source 3, which is configured to create an electron beam 5. To this end, the particle beam source 3 comprises an electron emitter 7 and an extraction electrode 9, which is at such an electric potential vis-à-vis the electron emitter 7 that electrons are extracted from a tip of the electron emitter 7 and emerge from the particle beam source 3 as a divergent beam 5. The divergent beam 5 is collimated by a collimator, which may comprise a plurality of electron-optical lenses 11, and is incident on a beam splitter 13, which is configured to create a bundle 15 of a plurality of electron beams 17 from the electrons of the electron beam 5. To this end, the beam splitter 13 comprises at least one multi-aperture plate 19, the latter being a plate which has a plurality of openings 21. The electrons of the electron beam 5 are incident on the multi-aperture plate 19, where one portion of these electrons is absorbed while another portion passes through the openings 21 and forms the electron beams 17 in the beam path downstream of the multi-aperture plate 19.

The beam splitter 13 may still have one or more further multi-aperture plates, which are arranged downstream of the multi-aperture plate 19 in the beam path of the electrons. Different voltages may be applied between the individual multi-aperture plates in order to influence the electron beams 17 and for example focus the latter such that each of the electron beams 17 is focused on a focus 25, with the foci 25 being located in or in the vicinity of a focal plane 23. Further elements influencing the electron beams 17, for example a field lens 27, may be provided in the beam path of the electron beams 17.

For example, the tip of the particle emitter 17 can be imaged into the focal plane 23 by the electron-optical elements arranged in the beam path between the electron emitter 7 and the focal plane 23 using each of the electron beams 17, with the result that each focus represents an image of the tip of the electron emitter 7.

The multi-beam particle beam system 1 further comprises an electron-optical unit 31, which is configured to focus each of the electron beams in an object plane 33 by virtue of the electron optical unit 31 being designed such that it images the focal plane 23 into the object plane 33. Since the foci 25 themselves are images of the tip of the electron emitter 7, images of this tip of the electron emitter 7 likewise arise in the object plane 33.

To this end, the electron-optical unit 31 comprises a plurality of lenses 45 and an objective lens 47. Moreover, a deflection magnet 49 and a beam splitter 51 are arranged in the beam path of the electron beams 17.

An object 35 is arranged relative to the multi-beam particle beam system 1 such that the surface 37 of the object is arranged in the object plane 33. The electron beams 17 incident on the surface 37 of the object 35 create secondary electrons and backscattered electrons at the object 35, and these move away from the surface 37 and are directed to a detector 43 by a projection system 41.

From the electrons, the electrons created by the electron beams 17 at the object 35, the objective lens 47 shapes separate electron beams 53. In this case, the beam paths of the electron beams 17 incident on the object 35 and the electron beams 53 emanating from the object 35 substantially coincide between the object 35 and the beam splitter 51, while the beam splitter 51 then separates the beam paths of the electron beams 53 emanating from the object 35 from those of the electron beams 17 incident on the object 35. The projection system 41 comprises a plurality of lenses 55, which are operated so that the object plane 33 is imaged on a surface 57 of the detector 43, with the result that the intensities of the electron beams 53 are able to be detected by the detector 43. The intensities of the electron beams 53 in turn depend on the properties of the object 55 at the locations at which the electron beams 17 are incident on the object 35. The multi-beam particle beam system 1 further comprises deflection elements and controllers, not depicted in FIG. 1, which serve to deflect the bundle 15 of electron beams 17 such that the locations of incidence of the electron beams 17 on the object 35 are systematically scanned over the surface thereof. The data obtained by way of the detection of the intensities of the electron beams 53, together with the deflections of the electron beams 17, represent an electron micrograph of the surface 37 of the object 35, which can be stored, processed further and interpreted.

The resolution of such an electron micrograph depends inter alia on the size of the regions on the surface 37 of the object 35 that are illuminated by the electron beams 17. To obtain the best possible resolution of the images, it is consequently desirable to illuminate spots on the surface 37 of the object which are as small as possible using the electron beams 17, which is to say the electron beams 17 are focused to the best possible extent in the object plane 33. For example, the smallest possible focus in the object plane 33 should be created for all of the electron beams 17.

It turns out that certain aberrations of the electron optical unit 31 make focusing of all of the electron beams 17 in the object plane 33 more difficult. For example, the electron optical unit 31 typically has an aberration known as field curvature, which leads to the foci of the electron beams 17 arising not in the flat object plane 33 but on a spherical surface which cannot coincide with the plane 33 everywhere, with the result that only a small number of electron beams 17 can be focused precisely in the plane 33 while other electron beams 17 in the beam path are focused in front of or behind this plane 33.

Moreover, the electron optical unit 31 may have an aberration known as field astigmatism, which leads to the foci of the electron beams 17 illuminating not a round spot that is a small as possible but an elliptically elongated spot in the possibly curved focal area.

It is therefore desirable to design the electron optical unit 31 such that aberrations present, which impair the focusing of the electron beams 17 in the object plane 33, are suppressed. To achieve this, a correction optical unit is arranged in the beam path of the electrons, upstream of the electron optical unit 31. The correction optical unit may be arranged at a plurality of locations in the beam path between the particle source 3 and the electron optical unit 31. Two options for arranging the correction optical unit are depicted in FIG. 1. Firstly, a correction optical unit 61A can be arranged in the beam path between the electron source 3 and the multi-aperture plate 19 of the beam splitter 13, with the result that the electron beam 5 passes through the correction optical unit 61A.

Second, a correction optical unit 61B can be arranged in the beam path between the multi-aperture plate 19 of the beam splitter 13 and the object plane 33, with the result that the bundle 15 of the electron beams 17 passes through the correction optical unit 61B. It is possible to provide only one of the two correction optical units 61A and 61B; however, two correction optical units 61A and 61B may also be provided. In the beam path shown in FIG. 1, the correction optical unit 61B is arranged between the focal plane 23 and the particle optical unit 31; however, it is also possible to arrange the correction optical unit 61B in the beam path upstream of the focal plane 23.

The correction optical units 61A and 61B, the design of which will be described in more detail hereinafter, are configured such that they influence the trajectories of the electrons of the electron beam 5 or of the electron beams 17 during the operation of the multi-beam particle beam system 1 such that the focusing of all of the particle beams 17 in the object plane 33 is improved. For example, the trajectories are influenced such that the field curvature is reduced, which is to say the shape of the surface in which the foci of the electron beams 17 are created by the objective lens 47 has less curvature and consequently can be better matched to the plane 33. Moreover, the trajectories can be influenced such that the astigmatic effect of the electron optical unit 31 on the particle beams 17 is at least partly compensated for, and hence the focusing of the particle beams 17 to form a small round spot is improved.

Figure 2:
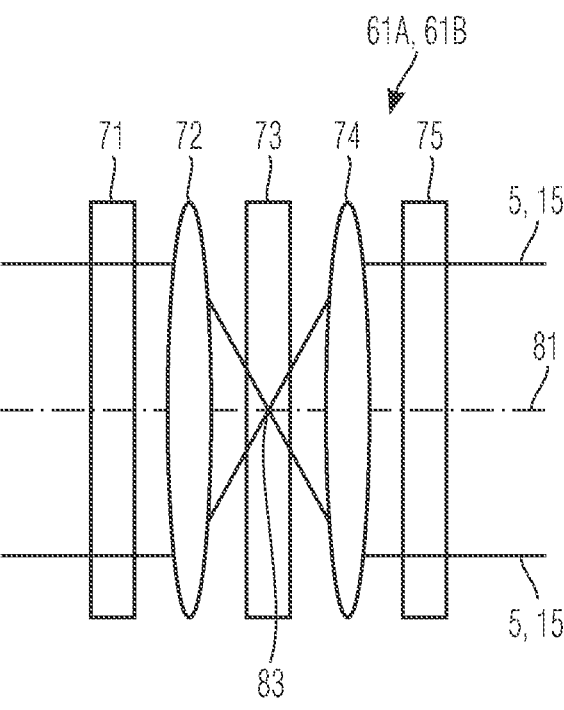
FIG. 2 shows a schematic illustration of a correction optical unit that is usable in the multi-beam particle beam system of FIG. 1.

FIG. 2 is a schematic illustration of electron-optical components, which can form the correction optical unit 61A or the correction optical unit 61B. These electron-optical components comprise a hexapod element 71, a round lens element 72, a hexapod element 73, a round lens element 74 and a hexapod element 75, which are successively arranged in the beam path of the electrons in this order. These elements are arranged in the beam path of the particle beam 5 when they form the correction optical unit 61A, and they are arranged in the beam path of the bundle 15 of the particle beams 17 when they form the correction optical unit 61B.

The elements 71 to 75 comprise coils, which are excited by currents, and/or electrodes, between which voltages are applied, in order to provide magnetic and/or electric fields which influence the trajectories of the electrons passing through the correction optical unit 61A, 61B. The fields provided by the round lens elements 72 and 74 have the monopole symmetry conventional for round lenses, while the fields provided by the hexapod elements 71, 73 and 75 have a hexapole symmetry. The one round lens 72 is arranged between the one pair of hexapod elements 71 and 73, and the other round lens 74 is arranged between the other pair of hexapod elements 73 and 75. The two round lens elements 72 and 74 each have an identical focal length. The distance between the two round lens elements 72 and 74 equals the focal length of the two round lens elements 72, 74, with the result that a crossover 83 of the particle beam 5 or bundle 15 of particle beams 17 is formed at the midpoint between the round lens elements. The strength of the excitations of the hexapod elements 71, 73 and 75 can be set so that the aberration of the electron optical unit 31 referred to as field curvature is partly compensated for, which is to say the radius of curvature of the sphere, in which the particle beams 17 are focused in the vicinity of the object plane 33, is increased.

Figure 3:
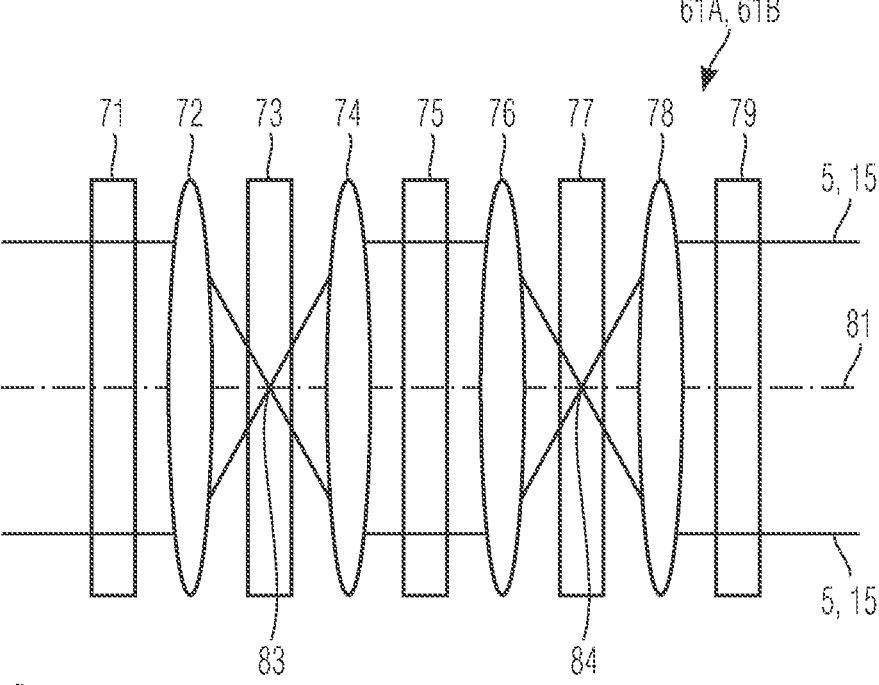
FIG. 3 shows a schematic illustration of a further correction optical unit that is usable in the multi-beam particle beam system of FIG. 1.

FIG. 3 is a schematic illustration of a further possible configuration of the correction optical units 61A, 61B. Like the correction optical unit shown in FIG. 2, the correction optical unit 61A, 61B shown in FIG. 3 comprises a hexapod element 71, a round lens element 72, a hexapod element 73, a round lens element 74 and a hexapod element 75, which are successively arranged in the beam path of the particle beam 5 or of the bundle 15 of the particle beams 17 in this order. Moreover, the correction optical unit 61A, 61B comprises a further round lens element 76, a further hexapod element 77, a yet further round lens element 78 and a yet further hexapod element 79, which are arranged in the beam path downstream of the hexapod element 75 in this order. The round lens elements 76 and 78, in turn, have the same focal length as the round lens elements 72 and 74, and the distance between the two round lens elements 76 and 78 is once again the same as the focal length, just like the distance between the two round lens elements 74 and 76. A crossover 83 is formed between the two round lens elements 72 and 74, and a further crossover 84 is formed between the two round lens elements 76 and 78. The hexapod elements 71, 73, 75, 77 and 79 can be excited such that they not only at least partly compensate for the aberration of the electron optical unit 31 referred to as field curvature but are also able to compensate for the aberration of the electron optical unit 31 referred to as field astigmatism.

Since a significant proportion of the electrons of the electron beam 5 strikes the multi-aperture plate 19 and a comparatively small proportion of the electrons passes through the multi-aperture plate 19 through the openings 21 in order to form the electron beams 17, the flux of electrons in the electron beam 5 in the beam path upstream of the multi-aperture plate 19 is higher than in the bundle 15 of the electron beams 17 in the beam path downstream of the multi-aperture plate 19. Accordingly, it is to be expected that the beam density of the electrons in the crossover 83, in the case of the correction optical unit of FIG. 2, or in the two crossovers 83 and 84, in the case of the correction optical unit of FIG. 3, is greater when arranged as correction optical unit 61A in the beam path upstream of the multi-aperture plate 19, while the beam density in the region of the crossovers 83, 84 is lower when arranged as correction optical unit 61B in the beam path downstream of the multi-aperture plate 19. The arrangement of the correction optical unit 61B in the beam path downstream of the multi-aperture plate 19 consequently can allow the beam density in the region of the crossover(s) 83 or 83 and 84 to be comparatively low, and hence the Coulomb repulsion of electrons within the beam is lower, allowing better focusing of the particle beams 17 in the object plane 33.

When the correction optical unit 61A is arranged in the beam path upstream of the multi-aperture plate 11, the correction optical unit 61A modifies the trajectories of the electrons of the electron beam 5 formed by the collimator using the lenses 11. The multi-aperture plate 11 can be matched to these modified trajectories, for example by virtue of the positions of the individual openings 21 in the plate being adapted. For example, the openings 21 in the plane of the plate can be provided in an arrangement that deviates from a regular grid. If further multi-aperture plates, which for example serve as lenses for influencing the individual electron beams 17 of the bundle 15, are provided in the beam path downstream of the multi-aperture plate 11 that serves as a beam splitter 13, then these further multi-aperture plates can likewise be matched to the modified trajectories, for example by virtue of the diameters of their openings being increased or the positions of their openings being adapted.

What is claimed is:

1. A multi-beam particle beam system, comprising:
a particle beam source configured to create a beam of charged particles;

a beam splitter comprising a multi-aperture plate with a multiplicity of openings arranged in a beam path of the beam of charged particles so that the beam splitter is configured to create a bundle of a plurality of particle beams from the charged particle beam;

a particle optical unit configured to focus each of the particle beams of the bundle of particle beams in an object plane; and a correction optical unit configured to compensate for at least one aberration of the particle optical unit, wherein:
the correction optical unit comprises a plurality of hexapod elements and a plurality of round lens elements;

the hexapod elements are successively arranged between the particle source and the multi-aperture plate in the beam path of the beam of charged particles;

for each pair of hexapod elements in direct succession in the beam path of the beam of charged particles, a round lens element is in the beam path between the pair of hexapod elements; and the number of hexapod elements totals three or five.

2. The multi-beam particle beam system of claim 1, wherein each round lens element between a pair of hexapod elements has an identical focal length.

3. The multi-beam particle beam system of claim 1, wherein:
the correction optical unit has a main axis;
each round lens elements is configured to provide an electric and/or a magnetic field to deflect the particles;

the electric and/or magnetic field provided by each round lens element having a monopole symmetry with respect to the main axis;

each hexapod element is configured to provide an electric and/or magnetic field to deflect the particles; and the electric and/or magnetic field provided by hexapod element having a hexapole symmetry with respect to the main axis.

4. The multi-beam particle beam system of claim 1, wherein:
the particle source comprises a particle emitter;
the multi-beam particle beam system is configured so that each of the particle beams creates an image of a part of the particle emitter in the beam path downstream of the beam splitter; and the multi-beam particle beam system is configured such that each of the particle beams images the image of the part of the particle emitter into the object plane.

5. The multi-beam particle beam system of claim 4, wherein the aberration of the particle optical unit comprises a field curvature and a field astigmatism configured to image the part of the particle emitter into the object plane.

6. The multi-beam particle beam system of claim 1, further comprising a projection system configured to project electrons emanating from the object plane onto a detector.

7. The multi-beam particle beam system of claim 6, wherein the projection system is configured to use the electrons emanating from the object plane to image the object plane into an image plane between the object plane and the detector or at the detector in a beam path of the electrons emanating from the object plane.

8. A multi-beam particle beam system, comprising:
a particle beam source configured to create a beam of charged particles;

a beam splitter comprising a multi-aperture plate with a multiplicity of openings arranged in a beam path of the beam of charged particles so that the beam splitter is configured to create a bundle of a plurality of particle beams from the charged particle beam;

a particle optical unit configured to focus each of the particle beams of the bundle of particle beams in an object plane; and a correction optical unit configured to compensate for at least one aberration of the particle optical unit, wherein:

the correction optical unit comprises a plurality of hexapod elements and a plurality of round lens elements;

the hexapod elements are successively arranged between the multi-aperture plate and the particle optical unit in a beam path of the bundle of particle beams;

for each pair of hexapod elements in direct succession in the beam path of the beam of the bundle of particle beams, a round lens element is arranged in the beam path of the beam of the bundle of particle beams between the pair of hexapod elements; and the number of hexapod elements totals three or five.

9. The multi-beam particle beam system of claim 8, wherein each round lens element between a pair of hexapod elements has an identical focal length.

10. The multi-beam particle beam system of claim 8, wherein:

the correction optical unit has a main axis;

each round lens elements is configured to provide an electric and/or a magnetic field to deflect the particles;

the electric and/or magnetic field provided by each round lens element having a monopole symmetry with respect to the main axis;

each hexapod element is configured to provide an electric and/or magnetic field to deflect the particles; and the electric and/or magnetic field provided by hexapod element having a hexapole symmetry with respect to the main axis.

11. The multi-beam particle beam system of claim 8, wherein:

the particle source comprises a particle emitter;

the multi-beam particle beam system is configured so that each of the particle beams creates an image of a part of the particle emitter in the beam path downstream of the beam splitter; and the multi-beam particle beam system is configured such that each of the particle beams images the image of the part of the particle emitter into the object plane.

12. The multi-beam particle beam system of claim 11, wherein the aberration of the particle optical unit comprises a field curvature and a field astigmatism configured to image the part of the particle emitter into the object plane.

13. The multi-beam particle beam system of claim 8, further comprising a projection system configured to project electrons emanating from the object plane onto a detector.

14. The multi-beam particle beam system of claim 13, wherein the projection system is configured to use the electrons emanating from the object plane to image the object plane into an image plane between the object plane and the detector or at the detector in a beam path of the electrons emanating from the object plane.

15. A method, comprising:

creating a beam of charged particles;

splitting the beam of charged particles into a bundle of a plurality of particle beams;

using a particle optical unit to focus each particle beam of the bundle of particle beams in an object plane; and using a correction unit to influence the beam of charged particles to compensate for at least one aberration of the particle optical unit, wherein:

the correction optical unit comprises a plurality of hexapod elements and a plurality of round lens elements;

the hexapod elements are successively arranged between the particle source and the multi-aperture plate in the beam path of the beam of charged particles;

for each pair of hexapod elements in direct succession in the beam path of the beam of charged particles, a round lens element is in the beam path between the pair of hexapod elements, and the number of hexapod elements totals three or five.

16. The method of claim 15, further comprising detecting electrons created at an object arranged in the object plane by each of the plurality of particle beams.

17. A method, comprising:

creating a beam of charged particles, splitting the beam of charged particles into a bundle of a plurality of particle beams;

using a particle optical unit to focus each particle beam of the bundle of particle beams in an object plane; and using a correction unit to influence the beam of charged particles to compensate for at least one aberration of the particle optical unit, wherein:

the correction optical unit comprises a plurality of hexapod elements and a plurality of round lens elements;

the hexapod elements are successively arranged between the multi-aperture plate and the particle optical unit in a beam path of the bundle of particle beams;

for each pair of hexapod elements in direct succession in the beam path of the beam of the bundle of particle beams, a round lens element is arranged in the beam path of the beam of the bundle of particle beams between the pair of hexapod elements; and the number of hexapod elements totals three or five.

18. The method of claim 17, further comprising:

using a particle emitter to create the beam of charged particles;

using each of the particle beams to image a part of the particle emitter into a respective intermediate image; and using a respective particle beam to image each intermediate image into a respective image of the part of the particle emitter into the object plane.

19. The method of claim 18, wherein the aberration of the particle optical unit comprises a field curvature and a field astigmatism to image the part of the particle emitter into the object plane.

20. The method of claim 17, further comprising detecting electrons created at an object arranged in the object plane by each of the plurality of particle beams.

* * * * *